United States Patent
Mari Curbelo et al.

(10) Patent No.: US 9,730,365 B2
(45) Date of Patent: Aug. 8, 2017

(54) HEAT SINK APPARATUS AND METHOD FOR POWER SEMICONDUCTOR DEVICE MODULE

(71) Applicant: General Electric Company, Schenectady, NY (US)

(72) Inventors: Alvaro Jorge Mari Curbelo, Garching B Munchen (DE); Simon Schoewel, Garching B Munchen (DE); Tiziana Bertoncelli, Garching B Munchen (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/378,250

(22) PCT Filed: Dec. 27, 2013

(86) PCT No.: PCT/US2013/077989
§ 371 (c)(1),
(2) Date: Aug. 12, 2014

(87) PCT Pub. No.: WO2014/106051
PCT Pub. Date: Jul. 3, 2014

(65) Prior Publication Data
US 2015/0296661 A1   Oct. 15, 2015

Related U.S. Application Data

(60) Provisional application No. 61/747,334, filed on Dec. 30, 2012.

(51) Int. Cl.
*H05K 7/20* (2006.01)
*H01L 23/427* (2006.01)
(Continued)

(52) U.S. Cl.
CPC ..... *H05K 7/20927* (2013.01); *H01L 23/3675* (2013.01); *H01L 23/427* (2013.01);
(Continued)

(58) Field of Classification Search
CPC ........... H05K 7/20936; H05K 7/20336; H05K 7/20318; H05K 7/1432; H01L 23/427;
(Continued)

(56) References Cited

U.S. PATENT DOCUMENTS 4,107,922 A * 8/1978 Wossner ................... F01N 3/24
165/104.26
5,506,032 A * 4/1996 Rowe .................. F28D 15/0233
428/116
(Continued)

FOREIGN PATENT DOCUMENTS

KR     1019960035989 A    12/1998

OTHER PUBLICATIONS

International IPRP & WO issued in Connection with corresponding Application No. PCT/US13/77989 dated Jul. 9, 2015.
(Continued)

*Primary Examiner* — Zachary M Pape
*Assistant Examiner* — Amir Jalali
(74) *Attorney, Agent, or Firm* — Global Patent Operation; John A. Kramer

(57) ABSTRACT

A heat sink has a base plate that has a first central portion, a second central portion, and a periphery, a first plurality of heat pipes embedded in the base plate that are arranged to convey heat away from the first central portion, and a second plurality of the heat pipes embedded in the base plate that are arranged to convey heat away from the second central portion, each of the heat pipes of the first and second pluralities having a hot end for receiving heat flow and a cool end for releasing heat flow. A switch package comprises
(Continued)

Figure 1:
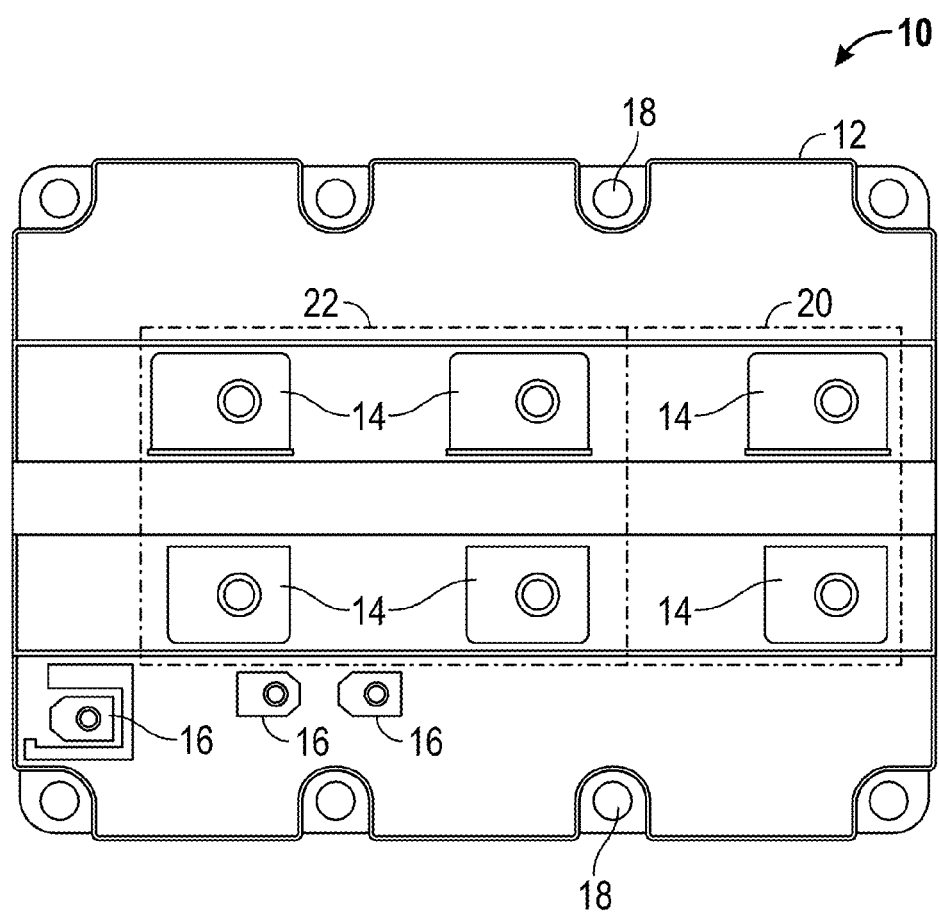

an inner casing half mounted to a module facing surface of the heat sink base plate, a semiconductor module mounted to the module facing surface of the heat sink within the inner casing half, and an outer casing half that encloses the heat sink.

18 Claims, 8 Drawing Sheets

(51) Int. Cl.
    *H01L 23/367*     (2006.01)
    *H01L 23/473*     (2006.01)

(52) U.S. Cl.
    CPC ....... *H01L 23/473* (2013.01); *H05K 7/20336* (2013.01); *H05K 7/20936* (2013.01); *H01L 2924/0002* (2013.01)

(58) Field of Classification Search
    CPC ............. H01L 23/3675; H01L 23/473; H01L 2924/0002; H01H 9/52; H01H 2009/523
    USPC .................. 361/698; 165/80.4–80.5, 104.33; 257/715, E23.088; 174/15.2
    See application file for complete search history.

(56) References Cited

U.S. PATENT DOCUMENTS

| | | | | |
|---|---|---|---|---|
| 6,352,104 | B1* | 3/2002 | Mok | H01L 23/427 165/104.33 |
| 6,964,295 | B1* | 11/2005 | Yu | H01L 23/427 165/104.21 |
| 7,443,677 | B1* | 10/2008 | Zhou | F28D 15/0275 165/104.21 |
| 9,429,369 | B2* | 8/2016 | Wu | F28D 15/0275 |
| 2002/0184894 | A1* | 12/2002 | Batchelor | F28F 1/045 62/3.3 |
| 2003/0056936 | A1* | 3/2003 | Lindemuth | F25B 23/006 165/45 |
| 2006/0108097 | A1* | 5/2006 | Hodes | F28F 3/048 165/80.4 |
| 2007/0187069 | A1* | 8/2007 | Ueno | F28D 15/0275 165/80.3 |
| 2009/0154102 | A1* | 6/2009 | Zhou | H01L 23/4006 361/700 |
| 2009/0236076 | A1* | 9/2009 | Min | F28D 15/0275 165/80.3 |
| 2009/0284924 | A1 | 11/2009 | Konshak et al. | |
| 2009/0314467 | A1* | 12/2009 | Campbell | H01L 23/4735 165/80.4 |
| 2009/0316360 | A1* | 12/2009 | Campbell | H01L 23/473 361/699 |
| 2010/0157526 | A1* | 6/2010 | Beaupre | H01L 23/473 361/689 |
| 2010/0172103 | A1* | 7/2010 | Du | H01L 23/4093 361/710 |
| 2010/0321888 | A1* | 12/2010 | Yamaguchi | F28D 15/0275 361/695 |
| 2011/0030924 | A1 | 2/2011 | Kawabata et al. | |
| 2011/0083446 | A1 | 4/2011 | Pinet | |
| 2011/0168358 | A1* | 7/2011 | Wu | F28D 15/0266 165/104.26 |
| 2011/0310585 | A1* | 12/2011 | Suwa | H05K 7/2089 361/820 |
| 2013/0118718 | A1* | 5/2013 | Chang | F28D 15/0275 165/104.26 |
| 2015/0233647 | A1* | 8/2015 | Quisenberry | F28D 15/04 62/3.7 |

OTHER PUBLICATIONS

Search Report issued in connection with corresponding PCT Application PCT/US2013/077989 on Apr. 29, 2014.

\* cited by examiner

HEAT SINK APPARATUS AND METHOD FOR POWER SEMICONDUCTOR DEVICE MODULE

BACKGROUND

Technical Field

Embodiments of the invention relate generally to heat transfer. Other embodiments relate to heat sinks for cooling transistor modules.

Discussion of Art

Certain semiconductor devices, such as a BJT, diode, IGBT, or MOSFET, can be used as switches to control a flow of current. Semiconductor devices can be bipolar, in which both holes and electrons carry charge across a junction in opposite directions; or unipolar, in which just one type of charge carrier (electron or hole) is used to carry charge across the junction. Some semiconductor devices are triggered by briefly supplying a small current across or adjacent the junction, such as transistors or thyristors. Other semiconductor devices are switched on by applying a constant bias voltage across the junction, such as FET, MOSFET, or IGBT. While triggered or switched on, semiconductor device switches carry current generally proportional to a junction area.

Manufacturing processes limit the achievable junction or channel area of the semiconductor chips on which electronic devices are built. Thus, in order to conduct an arbitrary current under a given voltage, an arbitrary number of chips may be packaged together as a module.

When a semiconductor device conducts electrical current, heat is produced by internal resistance of the device. When the heating rate of a module (having plural such semiconductor devices) exceeds the available heat dissipation, there is a risk of temperature rise affecting changes in electrical behavior, such that thermal damage could occur to portions of the module. Accordingly, it is important to provide adequate cooling for a semiconductor module, and to equalize temperatures as much as possible among chips comprising a semiconductor module.

Often, semiconductor modules are cooled by air convection, either forced or natural. Convective cooling rates are generally proportional to temperature difference, air velocity, and surface area. It may be desirable to maintain temperature difference as low as possible, in other words, to keep the transistor module as cool as possible. Air velocity typically is limited by available fan power (which may be zero for natural convective cooling). Thus, to achieve a low temperature difference it is necessary to enhance the cooling surface area of a transistor module. For this purpose, a module may be mounted to a heat sink. A typical heat sink comprises a base plate with the module mounted to a first working surface of the base plate and with fins protruding opposite the first working surface to form a second working surface of the base plate. Often, a heat sink is described in terms of "thermal resistance," which refers to a relationship of temperature difference to cooling rate.

Conventionally, thermal resistance is described using units of K/W. For example, a heat sink may be rated to provide 1 K/W thermal resistance from a first working surface to a coolant adjacent a second working surface. If heat is uniformly dissipated to the first working surface at a rate of 2 W, then the first working surface will be at 2 K above the temperature of coolant at the second working surface. However, thermal resistance values for heat sinks are misleading because thermal resistance quoted for a heat sink as a whole presumes uniform areal distribution of heat dissipation at the first working surface of the heat sink.

In real applications, heat dissipation is not areally uniform across a transistor module. For example, each semiconductor device within a module presents a discrete region of heating. Thus, if the transistors of a transistor module produce 5 W total heating and if the transistor module is mounted on a first working surface of a heat sink with 1 K/W overall thermal resistance, it is possible that temperatures at the first working surface of the heat sink, adjacent each of the transistors in the module, may be significantly more than 5 K above the coolant temperature adjacent a second working surface of the heat sink. Meanwhile, temperatures at the first working surface of the heat sink, distal from any of the transistors, may be significantly less than 5 K above the coolant temperature adjacent the second working surface.

Lateral heat transfer, within the base plate of a heat sink, tends to equalize temperatures across the first working surface of the heat sink, thereby bringing the heat sink closer to a uniform areal distribution of heat dissipation. Lateral heat transfer is limited by the thickness of the base plate, with a thinner base plate offering less lateral heat transfer, and less uniformity of heat dissipation. However, a thicker base plate presents greater thermal resistance from the first working surface to the second working surface, such that in designing an air-cooled heat sink for use with a transistor module, there is a tradeoff between achieving uniform heat dissipation and achieving minimum thermal resistance. Thus, air cooling constrains the achievable power through a module.

BRIEF DESCRIPTION

In embodiments, a heat sink has a base plate that has a first central portion, a second central portion, and a periphery, a first plurality of heat pipes embedded in the base plate that are arranged to convey heat away from the first central portion, and a second plurality of the heat pipes embedded in the base plate that are arranged to convey heat away from the second central portion. Each of the heat pipes of the first and second pluralities has a respective hot end for receiving heat flow and a respective cool end for releasing heat flow.

In embodiments, a switch package comprises a heat sink, an inner casing half, a semiconductor module, and an outer casing half. The heat sink has a base plate with a module facing (heat receiving) surface, a coolant facing (heat rejecting) surface, fins connected to the coolant facing surface, and heat pipes embedded in between the module facing surface and the coolant facing surface. The heat pipes are arranged to convey heat from a first central portion of the base plate to a second central portion of the base plate, and from the second central portion of the base plate to a periphery of the base plate. The inner casing half defines an opening for receiving the semiconductor module, with the module facing surface of the heat sink being fastened to an outer surface of the inner casing half. The semiconductor module is mounted to the module facing surface of the heat sink, and is received in the opening of the inner casing half. The outer casing half has interior partitions, which define at least one coolant inlet channel and a trough connected with the coolant inlet channel, the outer casing half being fastened to the outer surface of the inner casing half. The fins of the heat sink are enclosed in the trough.

In embodiments, a heat sink comprises a base plate, which defines a module facing surface, a coolant facing surface opposing the module facing surface, and a plurality of heat pipes embedded in the base plate between the module facing surface and the coolant facing surface. Each of the heat pipes has a respective hot end for receiving heat flow and a respective cool end for releasing heat flow. The module facing surface comprises a plurality of thermal regions, of which a first region receives a first heat flow, a second region adjacent the first region receives a second heat flow smaller than the first heat flow, and a plurality of additional regions do not receive heat flow or receive heat flows smaller than the second heat flow. The heat pipes comprise a first grouping of heat pipes that convey heat from the first region to the second region and a second grouping of heat pipes that convey heat from the second region to one or more of the additional regions. Cool ends of at least some of the first grouping of heat pipes extend alongside hot ends of at least some of the second grouping of heat pipes.

In another embodiment, a method is provided for a semiconductor switch module, e.g., a method for configuring and/or controlling the module for uniform reduced aging. The method comprises, during operation of the semiconductor switch module, transferring heat from a first central portion of the module to a second region of a heat sink and from the second region of the heat sink to a third region of the heat sink, such that the first central portion of the module and a second portion of the module remain at substantially uniform and equal temperatures under load. The module is mounted on the heat sink. The heat sink comprises a base plate, the base plate having a module facing surface to which the module is mounted, a coolant facing surface opposite the module facing surface, and a plurality of heat pipes embedded between the module facing surface and the coolant facing surface. The heat pipes are arranged to transfer heat from a first region of the heat sink to the second region of the heat sink and to the third region of the heat sink. The module is configured such that the first central portion of the module, disposed adjacent the first region of the heat sink, will be hard switched under load to generate heat at a first rate, while the second portion of the module, disposed adjacent the second region of the heat sink, will be soft switched under load to generate heat at a second rate lower than the first rate.

DRAWINGS

Figure 2A:
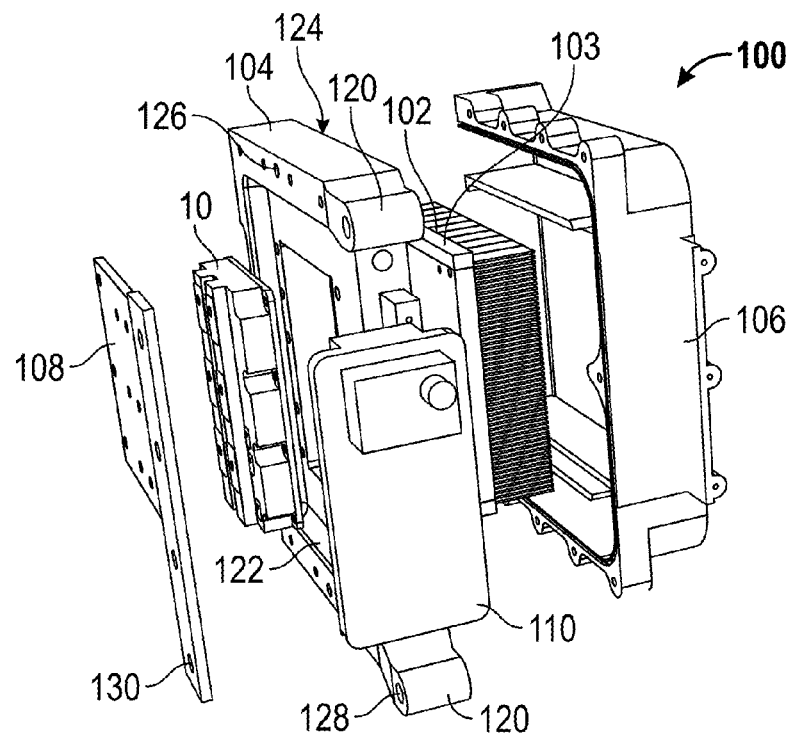
Figure 2B:
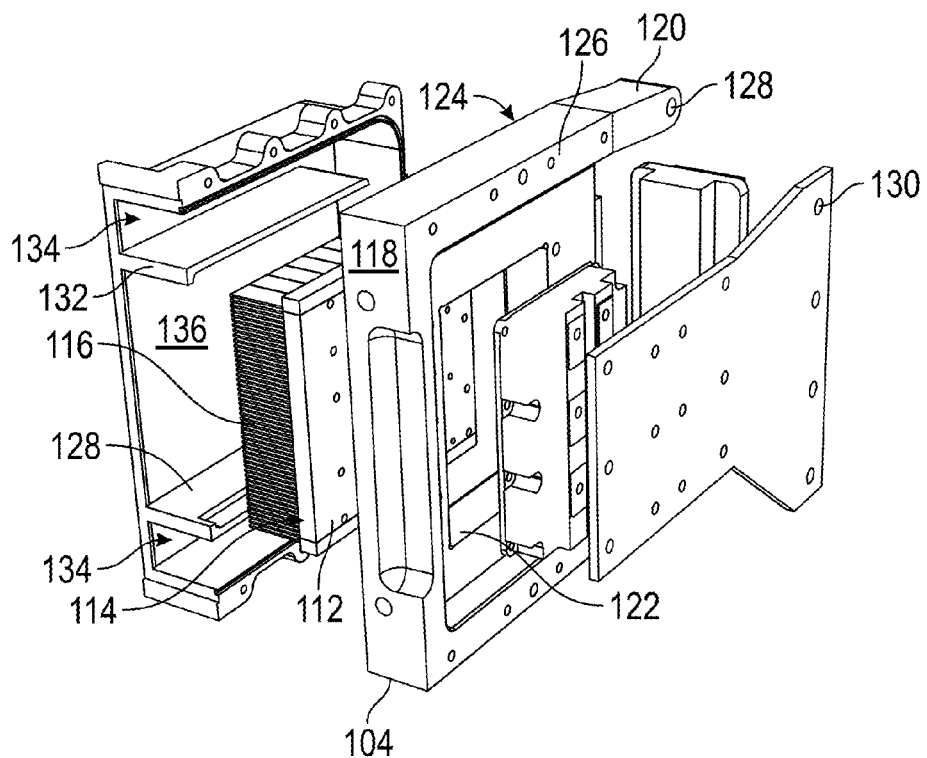
Figure 3:
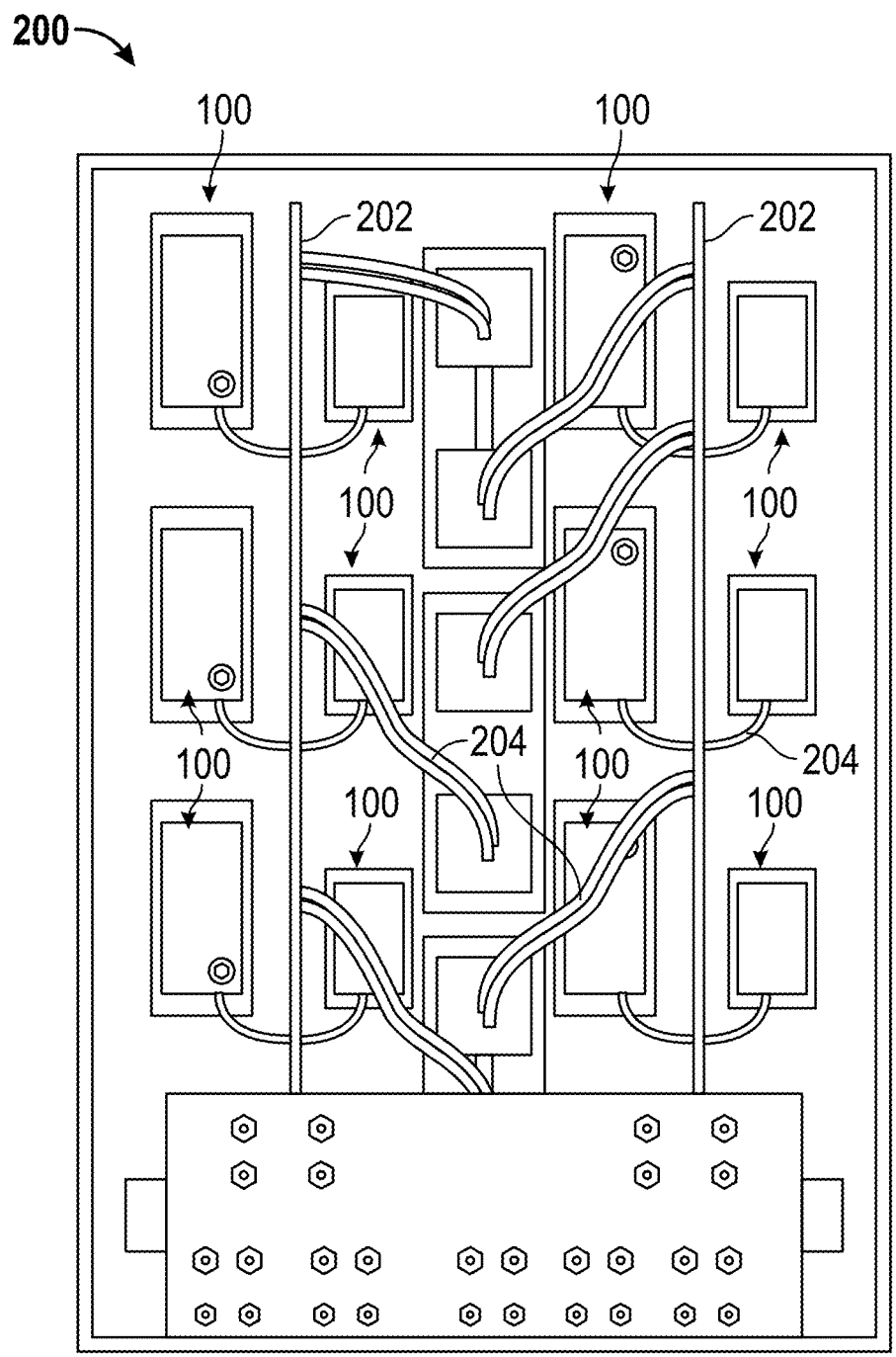
Figure 4A:
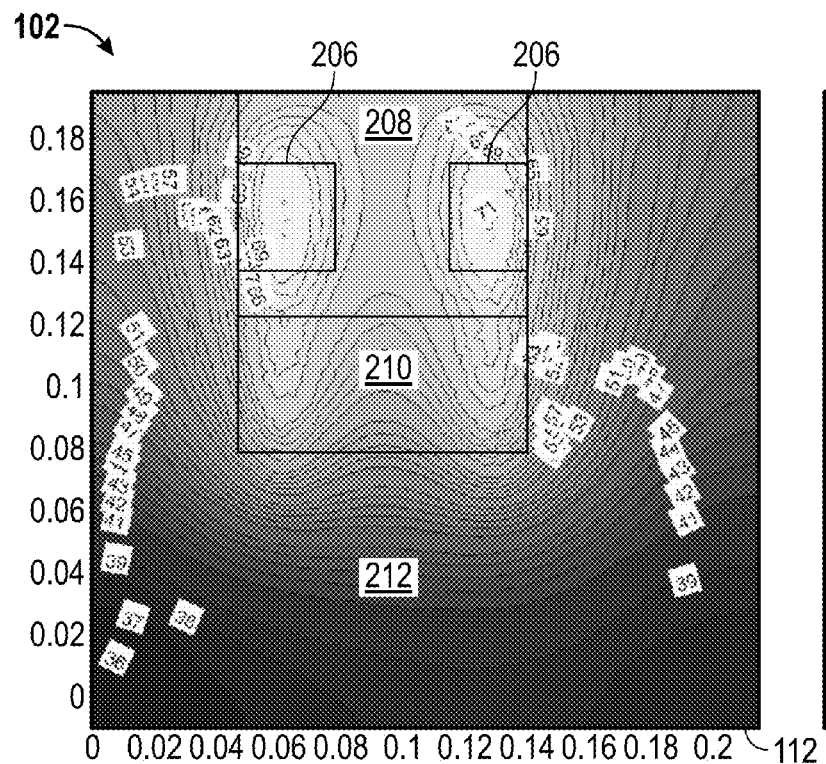
Figure 4B:
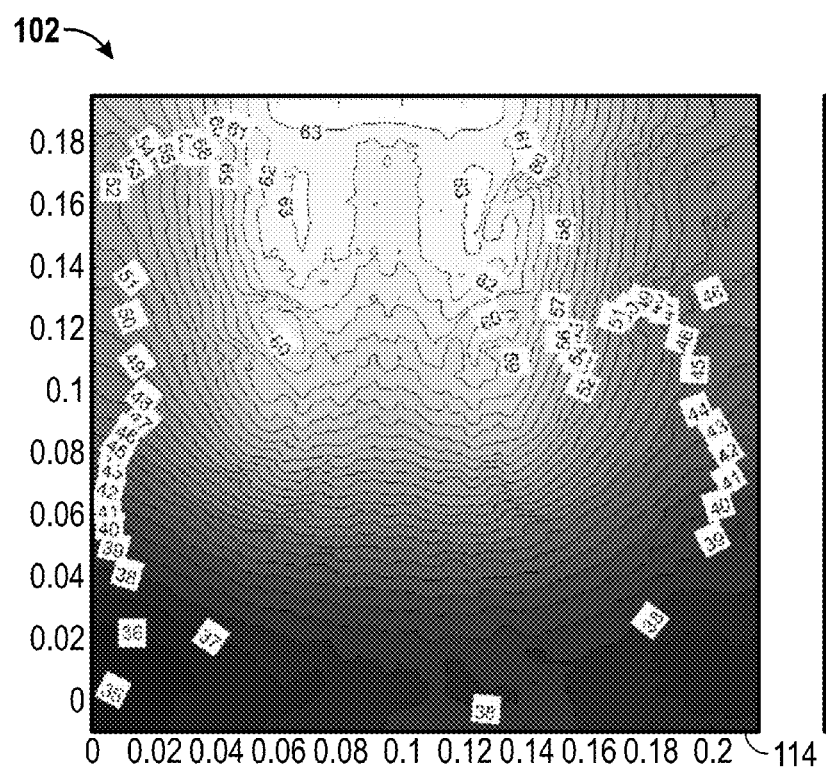
Figure 5A:
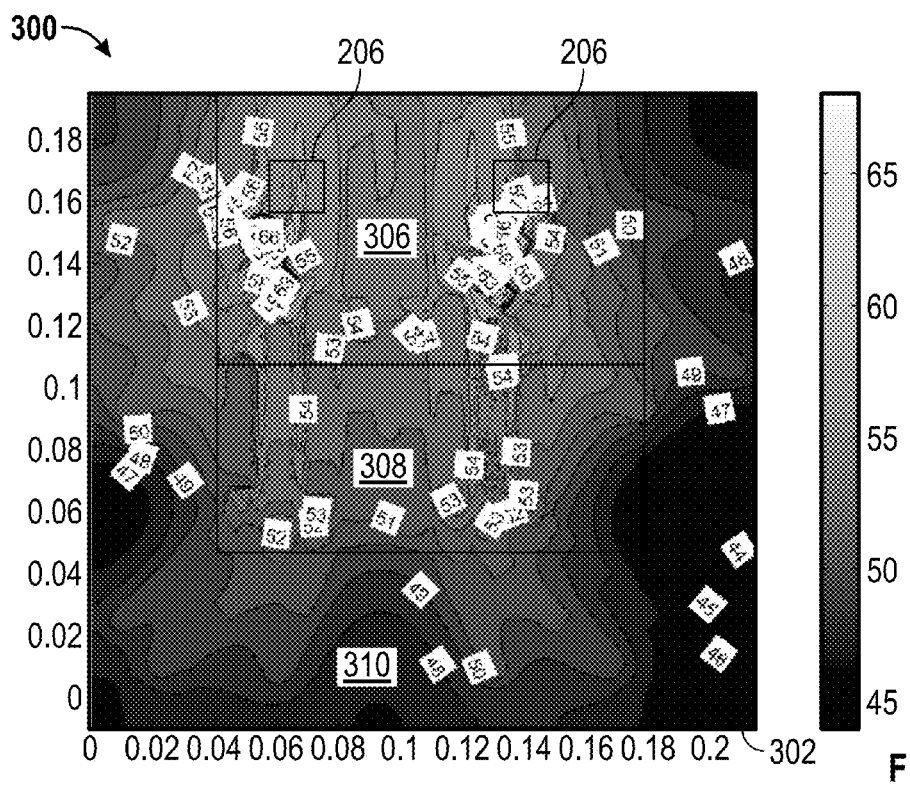
Figure 5B:
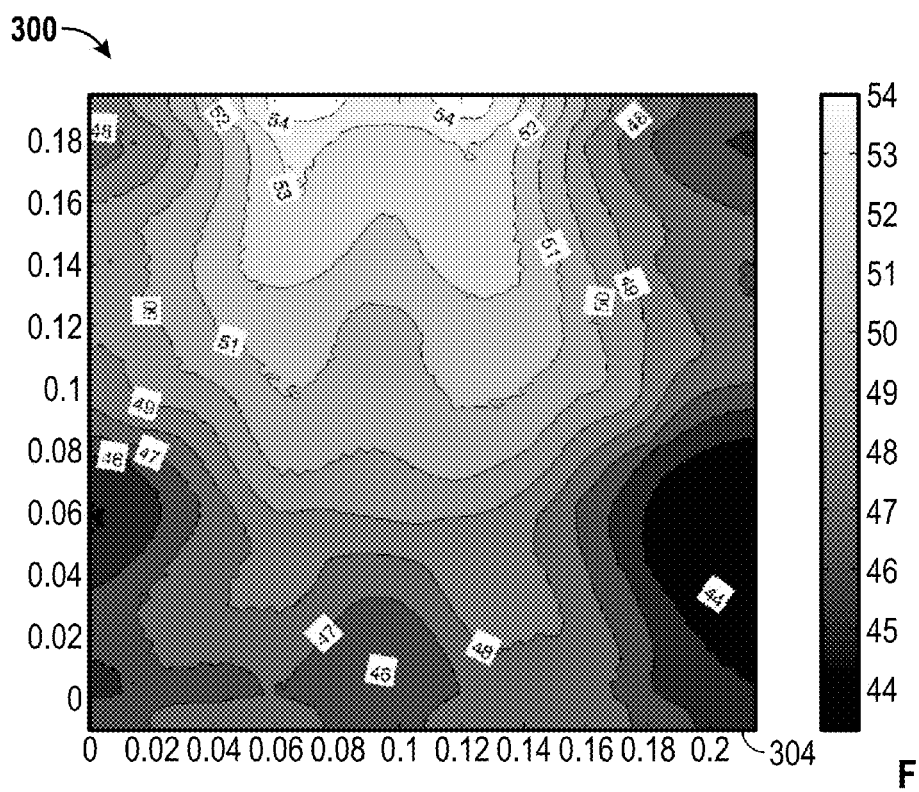
Figure 6:
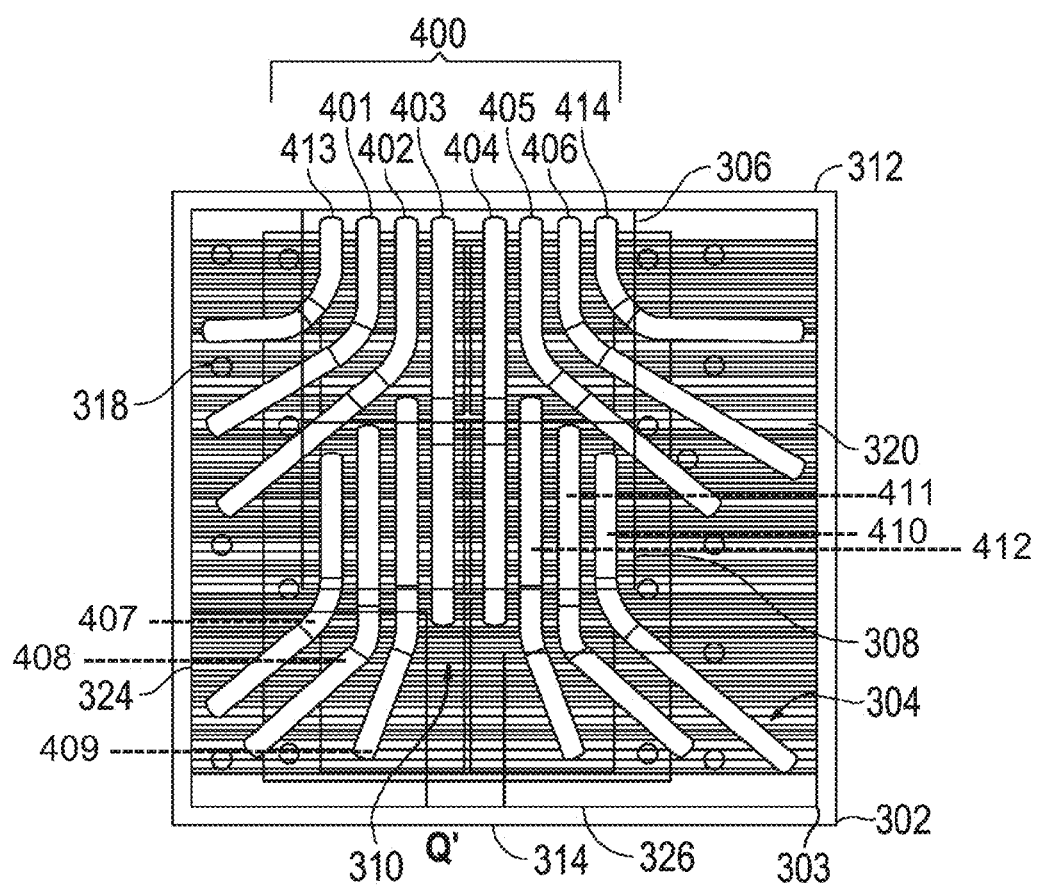
Figure 6:
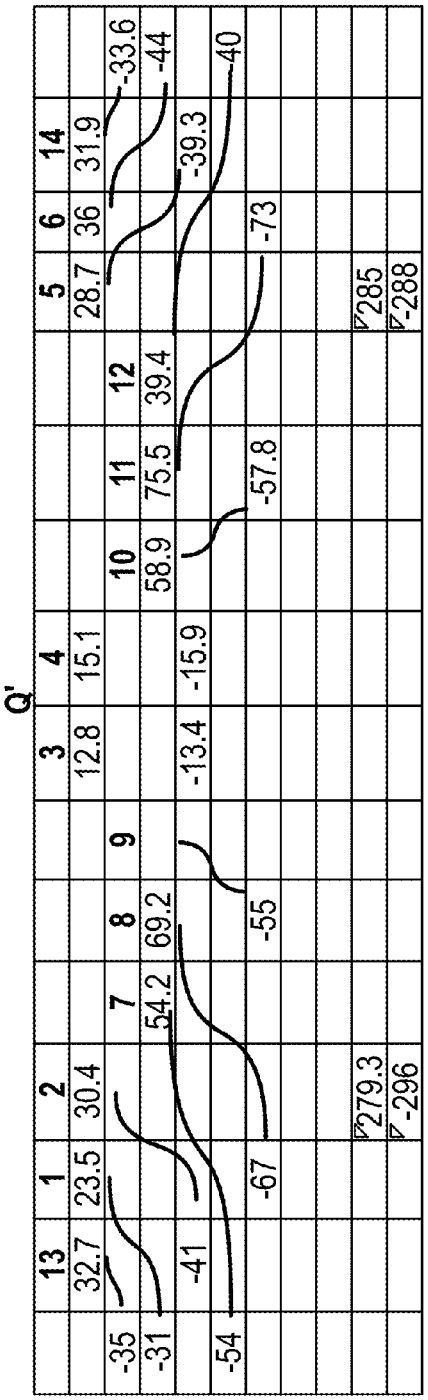
Figure 7:
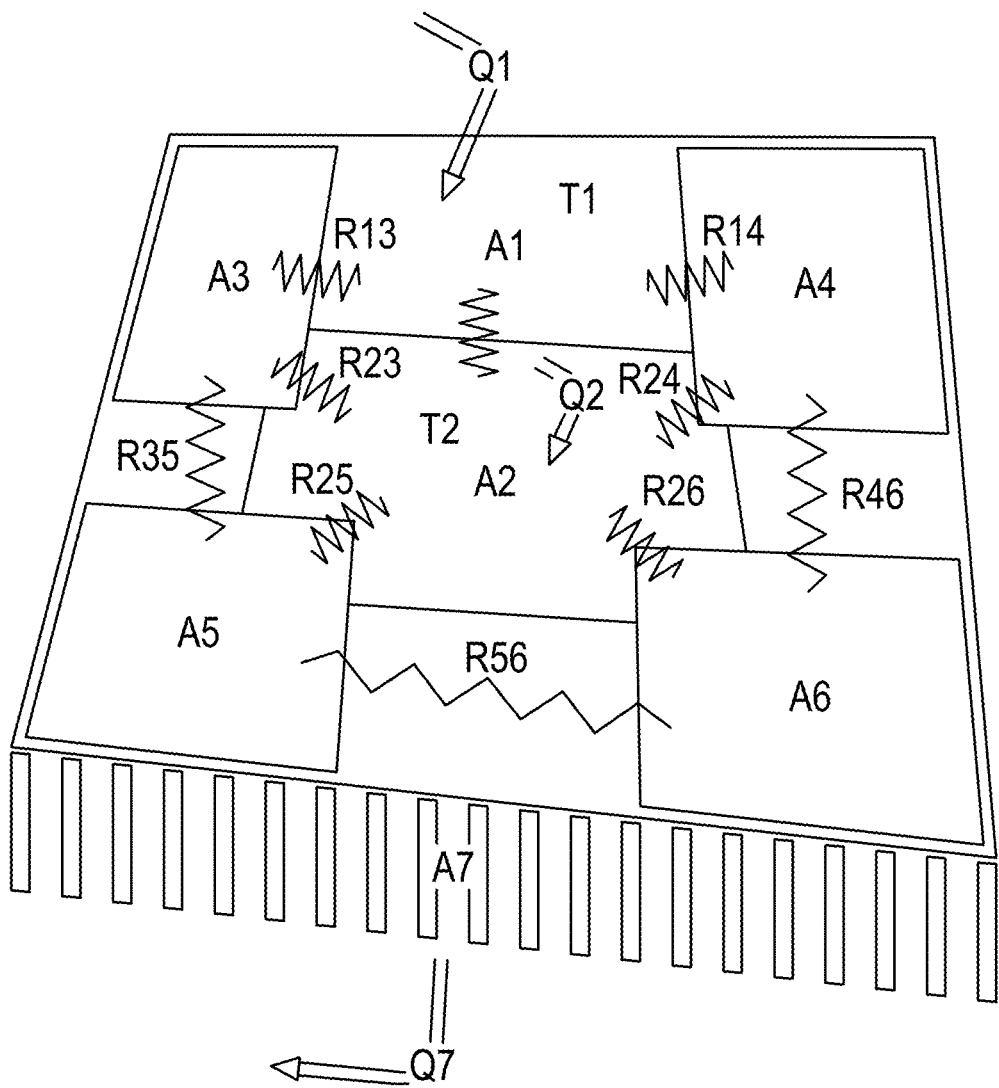

The invention will be better understood from reading the following description of non-limiting embodiments, with reference to the attached drawing figures, wherein below:

FIG. 1 is a plan view illustration of a semiconductor module;

FIG. 2, comprising FIGS. 2A and 2B, shows schematic exploded perspective views of a switch package including a semiconductor module, a heat sink, a package casing, a driver module, and a bus bar;

FIG. 3 is a schematic perspective view of a power converter cabinet enclosing a plurality of switch packages mounted on bus bars;

FIG. 4, comprising FIGS. 4A and 4B, shows temperature contours at surfaces of a conventional heat sink used within a power converter cabinet of the type shown in FIG. 3;

FIG. 5, comprising FIGS. 5A and 5B, shows temperature contours at surfaces of a heat sink, according to an embodiment of the invention, used within a power converter cabinet of the type shown in FIG. 3;

FIG. 6 is a schematic illustration of heat pipes layout within a heat sink, according to an embodiment of the invention; and FIG. 7 is a thermal circuit diagram of the heat pipes layout shown in FIG. 6.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the invention are described with respect to cooling a transistor module, embodiments of the invention also are applicable for use with electronic components, generally.

As used herein, the terms "substantially," "generally," and "about" indicate conditions within reasonably achievable manufacturing and assembly tolerances, relative to ideal desired conditions suitable for achieving the functional purpose of a component or assembly.

In embodiments, a heat sink has a base plate that has a first central portion, a second central portion, and a periphery, a first plurality of heat pipes embedded in the base plate that are arranged to convey heat away from the first central portion, and a second plurality of the heat pipes embedded in the base plate that are arranged to convey heat away from the second central portion. Each of the heat pipes of the first and second pluralities has a respective hot end for receiving heat flow and a respective cool end for releasing heat flow. The heat sink may provide enhanced lateral heat transfer across a module facing (heat receiving) surface of the heat sink without significantly increasing thermal resistance through the heat sink. More particularly, the heat sink may provide for lateral heat transfer away from the first central portion (disposed adjacent a hot region of the transistor module) and away from the second central portion (disposed away from the hot region of the transistor module).

FIG. 1 shows an exterior plan view of a semiconductor module 10 that has a housing 12 enclosing plural power semiconductor devices (not shown). The housing 12 mounts several power terminals 14 for connecting power cables to the enclosed semiconductor devices, and also mounts control terminals 16 for connecting gate signal cables to the enclosed semiconductor devices. At its periphery, the housing 12 comprises mounting holes 18 for fastening the semiconductor module 10 to a module facing surface of a heat sink (not shown in this figure).

Under certain electrical configurations, the semiconductor module 10 may be operated to have a "cool" region 20 and a "hot" region 22, such that the hot region 22 produces relatively more heat per unit area than does the cool region 20. For example, the cool region 20 may be "soft switched" (current started and interrupted under zero-current and/or zero-voltage condition), whereas the hot region 22 may be "hard switched" (current started and interrupted under non-zero current and/or voltage condition). Under such operating conditions, conventional monolithic heat sinks cannot be made sufficiently thick to equalize temperatures between the cool and hot regions 20, 22 of the semiconductor module 10, without also introducing an excessive thermal resistance from a module facing surface of a heat sink to a coolant facing surface of the heat sink. Thus, in embodiments of the invention, the module 10 is outfitted with a heat sink apparatus as set forth herein, which acts to equalize the temperatures between the cool and hot regions of the semiconductor module.

FIG. 2, comprising FIGS. 2A and 2B, shows in schematic exploded perspective views a switch package 100 that comprises a semiconductor module 10, a heat sink 102, an inner casing half 104, an outer casing half 106, a bus bar segment 108, and a driver module 110.

As further discussed below, the heat sink 102 comprises a base plate 103 with a module facing surface 112, a coolant facing surface 114, and fins 116 protruding from the coolant facing surface 114. The inner casing half 104 is a shell 118 with upper and lower arms 120 protruding from a front edge of the shell. Between the upper and lower arms 120, there is an opening 122 (e.g., square- or rectangular-shaped central opening) through the midsection of the shell 118. In assembling the switch package 100, the heat sink 102 is mounted to a coolant facing side 124 of the shell 118 to cover the opening 122. The semiconductor module 10 is mounted within the opening 122 to the module-facing surface 112 of the heat sink 102. The driver module 110 is electrically connected with the control terminals 16 of the semiconductor module 10, and is mounted to the inner casing half 104 between the upper and lower arms 120. The bus bar segment 108 is mechanically fastened and electrically connected to the power terminals 14 of the semiconductor module 10, and is mounted to a bus bar facing side 126 of the inner casing half 104, thereby capturing the semiconductor module 10 into the opening 122 of the inner casing half 104. The outer casing half 106 is fastened to the coolant facing side 124 of the inner casing half 104, thereby enclosing the heat sink 102. The entire switch package 100 then can be mounted to a main bus bar (not shown) by inserting a set of mechanical fasteners (not shown) through a set of mechanical fastening holes 128 that are formed in the arms 120 of the inner casing half 104, and by inserting a set of electrical fasteners (not shown) through electrical connection holes 130 that are formed at an edge of the bus bar segment 108.

Referring specifically to FIG. 2B, the outer casing half 106 has internal walls 132 that partition upper and lower inlet passages 134 from a central trough 136. The heat sink 102 fins 116 fit into the central trough 136 of the outer casing half 106. In operation, cooling air is blown into the switch package 100 via the inlet passages 134 of the outer casing half 106, and is exhausted from the switch package through the central trough 136 of the outer casing half 106, between the generally horizontal fins 116 of the heat sink 102. More specifically, when the switch package 100 is assembled, the passages 134 are enclosed on four sides. Cooling air is directed into the passages 134 generally in the direction of the indicated arrows (of element numbers 134). The air is forced to turn inwards due to a space between the internal walls 132 and the outer wall of the outer casing half 106, and then reverses direction for passage through the fins 116 and back out the side of the package 100 generally shown at the far left of FIG. 2B.

FIG. 3 shows in schematic perspective view a power converter cabinet 200 that houses plural switch packages 100. Each of the switch packages 100 is mounted to one of a plurality of main bus bars 202 by way of individual laminated bus bar segments 108, as described above with reference to FIG. 2. The plural driver modules 110 are coordinated by a master controller (not shown) via cabling 204 run from the backplane of the cabinet.

FIG. 4 (comprising views 4A and 4B) shows temperature contours of a conventional (homogeneous copper base plate) heat sink 102, for a typical switch package 100 mounted in the configuration discussed just above. In particular, FIG. 4A shows temperature contours at a module facing surface 112 of the conventional heat sink 102, whereas FIG. 4B shows temperature contours at a coolant facing (finned) surface 114 of the conventional heat sink 102. It will be apparent to one skilled in the art that the semiconductor module 10, within the switch package 100, produces hot spots 206 within a first portion 208 of the heat sink 102, and that conduction across the heat sink 102, to a cooler second central portion 210 and to a periphery 212, is inadequate to equalize temperatures at the module facing surface 112 or at the coolant facing surface 114. Also, the disparity of temperatures across the coolant facing surface 114 detracts from efficiency of heat exchange at the fins of the heat sink 102, thereby diminishing cooling power from what would be the case for a less heterogeneous temperature distribution.

By comparison, FIG. 5 (comprising views 5A and 5B) shows temperature contours of a heat sink 300 according to an embodiment of the invention, for a semiconductor module 10 mounted in the same configuration shown in FIGS. 2 and 3. (That is, the heat sink 300 may be used as the heat sink 102 in FIGS. 2A and 2B.) FIG. 5A is a schematic illustration of temperature contours at a module facing (heat receiving) surface 302 of the heat sink 300. FIG. 5B is a schematic illustration of temperature contours at a coolant facing (heat rejecting) surface 304 of the same exemplary heat sink 300. The exemplary heat sink 300 has a significantly reduced temperature gradient across each surface, relative to the conventional heat sink 102. In particular, an upper central portion 306, at module facing surface 302 of the exemplary heat sink 300, is at a lower temperature than is a corresponding upper central portion 208 of the exemplary conventional heat sink 102, and hot spots 206 on the exemplary heat sink 300 are at a lower temperature and are of smaller area than are the hot spots 206 on the conventional heat sink 102. Also, a lower central portion 308 of the exemplary heat sink 300 is at a lower temperature, and is at a closer temperature to the upper central portion 306, than is the case for the upper and lower central portions 208, 210 of the conventional heat sink 102.

FIG. 6 is a schematic detail view of heat pipes 401, 402, 403, 404, 405, 406, 407, 408, 409, 410, 411, 412, 413, 414 (collectively, "heat pipes 400") that are embedded into a base plate 303 of the heat sink 300 and that extend from the first (upper) central portion 306 to the second (lower) central portion 308 of the exemplary heat sink 300, and that extend from the second central portion 308 of the heat sink 300 to a peripheral portion 310 of the heat sink 300.

Heat pipes operate by evaporation and by capillary action of a working fluid within the heat pipes. At a hot end of a heat pipe, the working fluid evaporates, and vapor pressure pushes the vapor from the hot end to a cool end of the heat pipe, where the vapor condenses. Capillary action then returns the condensed working fluid from the cool end to the hot end. Thus, heat flows into the heat pipe at the hot end and out of the heat pipe at the cool end. In a middle section between the hot end and the cool end, the saturated vapor condition within the heat pipe constrains the flowing vapor to a constant temperature. However, in case the external temperature surrounding the middle section is sufficiently high to superheat the vapor, this leads to a boiling condition in which the heat pipe ceases to function.

Different types of heat pipe often are identified according to their capillary structure, and various types of heat pipe are usable in the invention, including grooved wall pipes, screen mesh pipes, and grooved or sintered wick pipes. Various working fluids also are usable within the temperature range of interest, including (by way of example) acetone, ethanol, methanol, water, and toluene.

Often, heat pipes are installed in a horizontal configuration such that gravity is not a factor in the action of the working fluid. Nonetheless, excessive length or excessive heat flow requirement can lead to a "dry out" phenomenon in which the capillary action is not sufficient to return the condensed working fluid to the evaporating (hot) end of the heat pipe. Dry out is only exacerbated by vertical mounting. Other limits on heat pipe performance are known to include viscous, sonic, entrainment, and boiling conditions based on characteristics of the working fluid and on heat transfer parameters such as the rate of heat flow or the driving temperature.

According to the invention, the heat sink 300 is oriented so that the various heat pipes 400 extend generally vertically. Thus, in case the heat sink 300 is vertically mounted with a hot region of a semiconductor module near an upper edge 312 of the heat sink, as shown in FIG. 5, then the cool ends of the heat pipes 400 will be below the hot ends of the heat pipes, such that gravity will pull against the capillary action drawing the condensed working fluid from the cool ends back to the hot ends. On the other hand, the evaporating working fluid will assist the capillary action by expanding and exerting a pressure on the condensed fluid. Therefore, each of the vertically oriented heat pipes 400 will have a maximum working length determined by at least the following parameters: heat pipe diameter, capillary pore size, working pressure, temperature difference (hot end to cold end), required heat flow, and working fluid properties. Thus, FIGS. 5A, 5B show a worst-case configuration in terms of heat pipe performance. Accordingly, the heat pipes 400 are designed to maintain the hot spot below a design temperature value in this worst case. For example, the range of temperatures does not exceed about 22 deg C., e.g., a minimum of 44 deg C. and a maximum of 66 deg C. By contrast, in a best case with hot spots near a bottom edge 314 of the module facing surface 302, the heat pipes 400 substantially equalize temperatures across the module facing surface 302.

As mentioned above, each of the generally vertically oriented heat pipes 400 has a maximum working length that is determined by factors including a required heat flow. Thus, the operational stress on a particular heat pipe can be characterized by a simple ratio of an actual length to a maximum working length for an actual heat flow (a "normalized length"); or by a simple ratio of an actual heat flow to a maximum working heat flow for an actual length (a "normalized heat flow").

The particular arrangement of heat pipes according to an embodiment of the invention, as shown in FIG. 6, is developed according to certain principles. The heat pipes 400 comprise a first grouping 401, 402, 413 that extend generally from the upper edge 312 of the heat sink 300 through the first or upper central portion 306 to a left periphery 318; a second grouping 405, 406, 414 that extend generally from the upper edge 312 of the heat sink 300 through the upper central portion 306 to a right periphery 320; a third grouping 403, 404 that extend from the upper edge 312 through the upper central portion 306 to the lower central portion 308; a fourth grouping 407, 408, 409 that extend from the lower central portion 308 to a lower left corner 324 of the heat sink 300; and a fifth grouping 410, 411, 412 that extend from the lower central portion 308 to a lower right corner 326 of the heat sink 300. (In the second part of FIG. 6, showing results of heat transfer values Q' of an embodiment of the invention, elements 13, 1, and 2 correspond to heat pipes 413, 401, 402, elements 7, 8, and 9 correspond to heat pipes 407, 408, 409, and so on.)

According to embodiments of the invention, the vertical dimension of the module facing surface 302, from the upper edge 312 to the lower edge 314, exceeds the maximum working length of the heat pipes. Therefore, the fourth and fifth groupings of heat pipes are provided to convey heat from the lower central portion 308 of the heat sink 300 (adjacent the midsections of the first and second groupings of heat pipes, and adjacent the cool ends of the third group of heat pipes) toward the lower edge 314. By conveying heat from the lower central portion 308 to the lower corners 324, 326, the fourth and fifth groupings of heat pipes 407 . . . 412 thereby expand lateral heat transfer across the module facing surface 302 and, by comparison to the conventional monolithic heat sink 102, cause the heat sink 300 to present a more uniform distribution of heat to the fins 116.

According to embodiments of the invention, heat pipes that are longer than an average length, or that extend across a larger-than-average temperature difference, are disposed closer together than are heat pipes that are shorter than the average length, or that extend across a smaller-than-average temperature difference. Thus, within each grouping of heat pipes, substantially equal normalized lengths or normalized heat flows are achieved. Consequently, the finned coolant facing surface 304 (as shown in FIG. 5B) is at closer to uniform temperature than is achievable by a monolithic heat sink 102 in the same configuration (as shown in FIG. 4B), which enhances the effective convective cooling area of the fins 116, thereby lowering the fins-to-ambient thermal resistance.

Thus, referring to the thermal circuit diagram of FIG. 7, heat sinks 300 according to embodiments of the invention have thermal regions A1, A2, A3, A4, A5, A6 at the module facing surface 302 and thermal region A7 at the finned coolant facing surface 304. According to an aspect of the invention, an exemplary heat sink 300 has substantially equal thermal resistances R12, R13, R14 approximating a first value, substantially equal thermal resistances R25, R26 approximating a second value higher than the first value, and substantially equal thermal resistances R35, R46 approximating a third value intermediate between the first and second values. Meanwhile, a semiconductor module 10 is mounted to the module facing surface 112 and is operated such that a heat production value Q1 is larger than a heat production value Q2. Accordingly, an areal average temperature T2 across region A2 is substantially equal to an areal average temperature T1 across region A1.

Thus, in embodiments, a heat sink has a base plate that has a first central portion, a second central portion, and a periphery, a first plurality of heat pipes embedded in the base plate that are arranged to convey heat away from the first central portion, and a second plurality of the heat pipes embedded in the base plate that are arranged to convey heat away from the second central portion, each of the heat pipes of the first and second pluralities having a hot end for receiving heat flow and a cool end for releasing heat flow. In some embodiments, the first plurality of the heat pipes comprises a first grouping, a second grouping, and a third grouping of the heat pipes, with the first grouping arranged to convey heat from the first portion to the second central portion, the second grouping and the third grouping arranged to convey heat from the first portion to the periphery. In certain embodiments, each of the first plurality of the heat pipes has substantially a same normalized length as each other of the first plurality of the heat pipes. In some embodiments, each of the first grouping of heat pipes has at least a portion of its cool end extending alongside at least a portion of a hot end of one of the second plurality of heat pipes. In particular embodiments, each of the first grouping of heat pipes extends substantially parallel to the hot ends of the second plurality of heat pipes. The second plurality of the heat pipes may comprise a fourth grouping and a fifth grouping of the heat pipes arranged to convey heat from the second central portion to opposite parts of the periphery. Each of the second plurality of the heat pipes may have substantially a same normalized length as each other of the second plurality of the heat pipes. Alternatively, each of the fifth grouping of the heat pipes may have a shorter normalized length than any of the fourth grouping of the heat pipes.

In some embodiments, a switch package comprises a heat sink, an inner casing half, a semiconductor module, and an outer casing half. The heat sink has a base plate with a module facing surface, a coolant facing surface with protruding fins, and heat pipes embedded in between the module facing surface and the coolant facing surface. The heat pipes are arranged to convey heat from a first portion of the base plate to a second central portion of the base plate, and from the second central portion of the base plate to a periphery of the base plate. Each of the heat pipes has a hot end for receiving heat flow and a cool end for releasing heat flow. The inner casing half defines an opening for receiving the semiconductor module, with the module facing surface of the heat sink being fastened to an outer surface of the inner casing half. The semiconductor module is mounted to the module facing surface of the heat sink, and is received in the opening of the inner casing half. The outer casing half has interior partitions, which define at least one coolant inlet channel and a trough connected with the coolant inlet channel, the outer casing half being fastened to the outer surface of the inner casing half, such that the fins of the heat sink are enclosed in the trough. In certain embodiments, the switch package also comprises a driver module electrically connected with the semiconductor module and configured to operate the semiconductor module such that a first heat generating region of the semiconductor module is overlying the first portion of the module facing surface while a second heat generating region of the semiconductor module is overlying the second central portion of the module facing surface, the first and second heat generating regions generating heat at first and second different rates, for example, the second rate being less than the first rate.

According to certain embodiments, a heat sink comprises a base plate, which defines a module facing (heat receiving) surface, a coolant facing (heat rejecting) surface opposing the module facing surface, and a plurality of heat pipes embedded in the base plate between the module facing surface and the coolant facing surface. Each of the heat pipes has a hot end for receiving heat flow and a cool end for releasing heat flow. The module facing surface comprises a plurality of thermal regions, of which a first region receives a first heat flow, a second region adjacent the first region receives a second heat flow smaller than the first heat flow, and a plurality of additional regions do not receive heat flow or receive heat flows smaller than the second heat flow. The heat pipes comprise a first grouping of heat pipes that convey heat from the first region to the second region and a second grouping of heat pipes that convey heat from the second region to one or more of the additional regions. Cool ends of at least some of the first grouping of heat pipes extend alongside hot ends of at least some of the second grouping of heat pipes. For example, the cool ends of the first grouping of heat pipes may extend substantially in parallel with the hot ends of the second grouping of heat pipes. Indeed, the first grouping of heat pipes may extend substantially in parallel with the hot ends of the second grouping of heat pipes. In certain embodiments, the first grouping of heat pipes may be spaced more closely than are the second grouping of heat pipes. In embodiments, the heat rejecting surface comprises a finned array and the heat pipes provide heat to at least one portion of the finned array that opposes at least one of the additional regions of the heat receiving surface. For example, the heat pipes are distributed to maintain substantially uniform temperature distribution among the regions of the heat receiving surface. As another example, the heat pipes are distributed to maintain substantially uniform temperature distribution across the heat rejecting surface.

In another embodiment, a switch package apparatus comprises a heat sink having a base plate with a module facing surface, a coolant facing surface, fins connected to the coolant facing surface, and heat pipes embedded in between the module facing surface and the coolant facing surface. The heat pipes are arranged to convey heat from a first central portion of the base plate to a second central portion of the base plate, and from the second central portion of the base plate to a periphery of the base plate. Each of the heat pipes having a respective hot end for receiving heat flow and a respective cool end for releasing heat flow. The switch package apparatus further comprises an inner casing half that defines an opening, the module facing surface of the heat sink being fastened to an outer surface of the inner casing half, and a semiconductor module mounted to the module facing surface of the heat sink, and received in the opening of the inner casing half. The switch package apparatus further comprises an outer casing half having interior partitions, which define at least one coolant inlet channel and a trough connected with the coolant inlet channel, the outer casing half being fastened to the outer surface of the inner casing half. The fins of the heat sink are enclosed in the trough.

In another embodiment of the switch package apparatus, the apparatus further comprises a driver module electrically connected with the semiconductor module and configured to operate the semiconductor module such that a first heat-generating region of the semiconductor module is overlying the first central portion of the module facing surface while a second heat-generating region of the semiconductor module is overlying the second central portion of the module facing surface. The first and second heat-generating regions generate heat at respective first and second different rates.

In another embodiment of the switch package apparatus, the second rate is less than the first rate.

In another embodiment, a heat sink comprises a base plate defining a heat receiving surface, a heat rejecting surface opposing the heat receiving surface, and a plurality of heat pipes embedded in the base plate between the heat receiving surface and the heat rejecting surface. Each of the heat pipes has a respective hot end for receiving heat flow and a respective cool end for releasing heat flow. The heat receiving surface comprises a plurality of thermal regions, of which a first region receives a first heat flow, a second region adjacent the first region receives a second heat flow smaller than the first heat flow, and a plurality of additional regions do not receive heat flow or receive heat flows smaller than the second heat flow. The heat pipes comprise a first grouping of heat pipes that convey heat from the first region to the second region and a second grouping of heat pipes that convey heat from the second region to one or more of the additional regions. Cool ends of at least some of the first grouping of heat pipes extend alongside hot ends of at least some of the second grouping of heat pipes.

In another embodiment of the heat sink, the cool ends of the first grouping of heat pipes extend substantially in parallel with the hot ends of the second grouping of heat pipes.

In another embodiment of the heat sink, the first grouping of heat pipes extend substantially in parallel with the hot ends of the second grouping of heat pipes.

In another embodiment of the heat sink, the first grouping of heat pipes are spaced more closely than are the second grouping of heat pipes.

In another embodiment of the heat sink, the heat rejecting surface comprises a finned array and the heat pipes provide heat to at least one portion of the finned array that opposes at least one of the additional regions of the heat receiving surface.

In another embodiment of the heat sink, the heat pipes are distributed to maintain substantially uniform temperature distribution among the regions of the heat receiving surface.

In another embodiment of the heat sink, the heat pipes are distributed to maintain substantially uniform temperature distribution across the heat rejecting surface.

In other aspects, a method is provided for uniform reduced aging of a semiconductor switch module. The method comprises mounting the module on a heat sink that comprises a base plate, the base plate having a module facing surface to which the module is mounted, a coolant facing surface opposite the module facing surface, and a plurality of heat pipes embedded between the module facing surface and the coolant facing surface, the plurality of heat pipes arranged to transfer heat from a first region of the heat sink to a second region and to a third region of the heat sink. The module then is configured such that a first portion of the module, disposed adjacent the first region of the heat sink, will be hard switched under load to generate heat at a first rate, while a second portion of the module, disposed adjacent the second region of the heat sink, will be soft switched under load to generate heat at a second rate lower than the first rate. During operation of the module, heat is transferred from the first portion of the module to the second region of the heat sink and from the second region of the heat sink to the third region of the heat sink, such that the first portion of the module and the second portion of the module remain at substantially uniform and equal temperatures under load.

In another embodiment, a method is provided for a semiconductor switch module, e.g., a method for configuring and/or controlling the module for uniform reduced aging. The method comprises mounting the module on a heat sink that comprises a base plate, the base plate having a module facing surface to which the module is mounted, a coolant facing surface opposite the module facing surface, and a plurality of heat pipes embedded between the module facing surface and the coolant facing surface, the plurality of heat pipes arranged to transfer heat from a first region of the heat sink to a second region and to a third region of the heat sink. The module then is configured such that a first portion of the module, disposed adjacent the first region of the heat sink, will be hard switched under load to generate heat at a first rate, while a second portion of the module, disposed adjacent the second region of the heat sink, will be soft switched under load to generate heat at a second rate lower than the first rate. During operation of the module, heat is transferred from the first portion of the module to the second region of the heat sink and from the second region of the heat sink to the third region of the heat sink, such that the first portion of the module and the second portion of the module remain at substantially uniform and equal temperatures under load.

In another embodiment, a method is provided for a semiconductor switch module, e.g., a method for configuring and/or controlling the module for uniform reduced aging. The method comprises hard switching under load a first portion of the module, which is disposed adjacent a first region of a heat sink, to generate heat at a first rate. A second portion of the module, disposed adjacent a second region of the heat sink, is soft switched under load to generate heat at a second rate lower than the first rate. The module is mounted on the heat sink that comprises a base plate, the base plate having a module facing surface to which the module is mounted, a coolant facing surface opposite the module facing surface, and a plurality of heat pipes embedded between the module facing surface and the coolant facing surface. The heat pipes are arranged to transfer heat from the first region of the heat sink to the second region and to a third region of the heat sink. The method further comprises, during operation of the module, transferring heat from the first portion of the module to the second region of the heat sink and from the second region of the heat sink to the third region of the heat sink, such that the first portion of the module and the second portion of the module remain at substantially uniform and equal temperatures under load.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects.

This written description uses examples to disclose several embodiments of the invention, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described embodiments, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An apparatus comprising:
a base plate having a first central portion, a second central portion, a periphery, a module facing surface, a coolant facing surface, and fins connected to the coolant facing surface;
a first plurality of heat pipes embedded in the base plate that are arranged to convey heat away from the first central portion; and
a second plurality of heat pipes embedded in the base plate that are arranged to convey heat away from the second central portion, each of the heat pipes of the first and second pluralities having a respective hot end for receiving heat flow and a respective cool end for releasing heat flow, wherein the first plurality of heat pipes and the second plurality of heat pipes are embedded in between the module facing surface and the coolant facing surface, the first plurality of heat pipes arranged to convey heat from the first central portion of the base plate to the second central portion of the base plate, and the second plurality of heat pipes arranged to convey heat away from the second central portion of the base plate to the periphery of the base plate;
an inner casing half that defines an opening, the module facing surface of the heat sink being fastened to an outer surface of the inner casing half;
a semiconductor module mounted to the module facing surface of the heat sink, and received in the opening of the inner casing half; and
an outer casing half having interior partitions, which define at least one coolant inlet channel and a trough connected with the coolant inlet channel, the outer casing half being fastened to the outer surface of the inner casing half, wherein the fins of the heat sink are enclosed in the trough.

2. The apparatus of claim 1, wherein each of the first plurality of the heat pipes has substantially a same normalized length as each other of the first plurality of the heat pipes.

3. The apparatus of claim 1, wherein each of the first plurality of heat pipes has at least a portion of its cool end extending alongside at least a portion of a hot end of one of the second plurality of heat pipes.

4. The apparatus of claim 1, wherein each of the first plurality of heat pipes extends substantially parallel to the hot ends of the second plurality of heat pipes.

5. The apparatus of claim 1, wherein the second plurality of the heat pipes comprises a fourth grouping and a fifth grouping of the heat pipes arranged to convey heat from the second central portion to opposite p arts of the periphery.

6. The apparatus of claim 5, wherein each of the fifth grouping of the heat pipes has a shorter normalized length than any of the fourth grouping of the heat pipes.

7. The apparatus of claim 1, wherein each of the second plurality of the heat pipes has substantially a same normalized length as each other of the second plurality of the heat pipes.

8. The apparatus of claim 1, wherein at least one of the first plurality of the heat pipes has its cool end extending alongside the hot end of at least one of the second plurality of the heat pipes.

9. The apparatus of claim 1, further comprising a driver module electrically connected with the semiconductor module and configured to operate the semiconductor module such that a first heat-generating region of the semiconductor module is overlying the first central portion of the module facing surface while a second heat-generating region of the semiconductor module is overlying the second central portion of the module facing surface, the first and second heat-generating regions generating heat at respective first and second different rates.

10. The apparatus of claim 9, wherein the second rate is less than the first rate.

11. The apparatus of claim 1, wherein:
the base plate defines a heat receiving surface and a heat rejecting surface opposing the heat receiving surface, and wherein the first plurality of heat pipes and the second plurality of heat pipes are embedded in the base plate between the heat receiving surface and the heat rejecting surface;
the heat receiving surface comprises a plurality of thermal regions, of which a first region receives a first heat flow, a second region adjacent the first region receives a second heat flow smaller than the first heat flow, and a plurality of additional regions do not receive heat flow or receive heat flows smaller than the second heat flow; and
the first plurality of heat pipes are configured to convey heat from the first region to the second region and the second plurality of heat pipes are configured to convey heat from the second region to one or more of the additional regions, and the cool ends of at least some of the first plurality of heat pipes extend alongside the hot ends of at least some of the second plurality of heat pipes.

12. The apparatus of claim 11, wherein the cool ends of the first plurality of heat pipes extend substantially in parallel with the hot ends of the second plurality of heat pipes.

13. The apparatus of claim 11, wherein the first plurality of heat pipes extend substantially in parallel with the hot ends of the second plurality of heat pipes.

14. The apparatus of claim 11, wherein the first plurality of heat pipes are spaced more closely than are the second plurality of heat pipes.

15. The apparatus of claim 11, wherein the heat rejecting surface comprises a finned array and the heat pipes provide heat to at least one portion of the finned array that opposes at least one of the additional regions of the heat receiving surface.

16. The apparatus of claim 11, wherein the heat pipes are distributed to maintain uniform temperature distribution among the regions of the heat receiving surface.

17. The apparatus of claim 11, wherein the first and second plurality of heat pipes are distributed to maintain uniform temperature distribution across the heat rejecting surface.

18. A method for a semiconductor switch module, comprising:
during operation of the semiconductor switch module, transferring heat from a first central portion of the module to a second region of a heat sink and from the second region of the heat sink to a third region of the heat sink, such that the first central portion of the module and a second portion of the module remain at uniform and equal temperatures under load,
wherein the module is mounted on the heat sink, the heat sink comprising a base plate, the base plate having a module facing surface to which the module is mounted, a coolant facing surface opposite the module facing surface, and a plurality of heat pipes embedded between the module facing surface and the coolant facing surface, the plurality of heat pipes arranged to transfer heat from a first region of the heat sink to the second region of the heat sink and to the third region of the heat sink, and wherein the module is configured such that the first central portion of the module, disposed adjacent the first region of the heat sink, will be hard switched under load to generate heat at a first rate, while the second portion of the module, disposed adjacent the second region of the heat sink, will be soft switched under load to generate heat at a second rate lower than the first rate.

* * * * *